United States Patent [19]
Jozwiak et al.

[11] Patent Number: 5,668,698
[45] Date of Patent: Sep. 16, 1997

[54] SMART CONNECTOR FOR AN ELECTRICAL DEVICE

[75] Inventors: Andrew Joseph Jozwiak, Warren; Melodee Ann Chapin, Cortland, both of Ohio

[73] Assignee: General Motors Corporation, Detroit, Mich.

[21] Appl. No.: 589,689

[22] Filed: Jan. 22, 1996

[51] Int. Cl.$^6$ ............................................. H05K 5/06
[52] U.S. Cl. .................... 361/752; 361/819; 439/76.1; 439/620; 439/621
[58] Field of Search .................. 361/728, 733, 361/752, 785, 819, 826; 439/76.1, 77, 82, 67, 931, 620, 621, 622, 752, 752.5

[56] References Cited

U.S. PATENT DOCUMENTS

| | | | |
|---|---|---|---|
| 4,673,363 | 6/1987 | Hudson et al. | 361/752 |
| 4,674,809 | 6/1987 | Hollyday et al. | 439/620 |
| 4,679,885 | 7/1987 | Nestor et al. | 439/620 |
| 4,758,921 | 7/1988 | Hung | 439/620 |
| 4,879,630 | 11/1989 | Boucard et al. | 361/785 |
| 5,008,956 | 4/1991 | Hemmie | 361/752 |
| 5,015,207 | 5/1991 | Koepke | 439/931 |
| 5,023,752 | 6/1991 | Detter et al. | 361/399 |
| 5,034,846 | 7/1991 | Hodge et al. | 361/752 |
| 5,141,454 | 8/1992 | Garrett et al. | 439/620 |
| 5,147,217 | 9/1992 | Neale, III et al. | 439/403 |
| 5,207,587 | 5/1993 | Hamill et al. | 439/76 |
| 5,238,429 | 8/1993 | Margrave et al. | 439/620 |

*Primary Examiner*—Leo P. Picard
*Assistant Examiner*—John B. Vigushin
*Attorney, Agent, or Firm*—Anthony Luke Simon

[57] ABSTRACT

A smart connector for an electrical device comprising: a circuit board including a flat surface for receiving at least one surface-mounted circuit component, a plurality of extending male blades formed in a first end of the circuit board, a plurality of female receptacles formed at a second end of the circuit board opposite the first end, wherein (i) an exterior of each of the extending male blades, (ii) an interior of each of the female receptacles and (iii) a select portion of the flat surface all include electrically conductive circuit traces; and a connector housing having a first end with a plurality of female terminal receptacles for terminating a wiring harness, a body portion for housing the circuit board and a second end, wherein the male blades are each received in a separate one of the plurality of female terminal receptacles and wherein the plurality of female receptacles are located at the second end of the housing for receiving a set of extending male terminals of an electrical device. The smart connector is capable of being sealed to the electrical device to provide protection of the circuit board from an environment outside the housing.

15 Claims, 2 Drawing Sheets

SMART CONNECTOR FOR AN ELECTRICAL DEVICE

This invention relates to a smart connector for an electrical device.

BACKGROUND OF THE INVENTION

In a known manner of controlling a sealed electrical device such as a relay in an automotive vehicle, the electrical device is electrically connected to a remotely mounted control module through a wiring harness. The wiring harness is connected to the electrical device through a known sealed connector structure.

One example implementation of the control module and relay may be for the vehicle's rear defogger. The rear defogger power is switched on and off by a relay controlled by a timer module, which in turn receives an on/off signal from an instrument panel mounted switch. An electrical wiring harness must provide power and the on/off signal to the control module, which sends the relay control signals through another electrical wiring harness connected to the relay.

In a known manner of eliminating the necessity of control modules separately mounted from the electrical devices, the electrical device and control module may be provided in a single sealed unit connected to a wiring harness through a single sealed connection. Such units have been referred to as "smart" units. A disadvantage of known "smart" units is that, because they are sealed, they are not serviceable. If a part of the "smart" unit fails, the whole unit must be replaced even though it is typically only the electrical device that fails.

SUMMARY OF THE INVENTION

It is an object of this invention to provide a smart connector for an electrical device according to Claim 1.

Advantageously, this invention provides a smart connector for an electrical device, such as a relay or other electrical device, that eliminates the necessity of a remote mounted control circuit module and the electrical wiring harnesses associated therewith.

Advantageously, this invention provides a novel smart connector for the electrical device that allows serviceability of the electrical device.

Advantageously, this invention provides a connector for an electrical device that includes a control circuit for the electrical device within a housing of the connector wherein, when the electrical device is connected to the connector, it is connected to the control circuit.

Advantageously, this invention provides an electrical connector suitable for use in a multiplex control system for controlling an electrical device.

Advantageously, in a preferred example of this invention, a smart connector for an electrical device achieves an advantageous structure with a minimum number of parts to provide an end connector for a wiring harness, a control circuit module for an electrical device and a connector for the electrical device all in one unit. More particularly, this preferred structure includes a single molded or fabricated connector housing having a first end for terminating a wiring harness, a first body portion for housing a control circuit module and a second end together with the control circuit module connecting to the electrical device.

The efficient and advantageous preferred structure is further obtained by the construction of the electric circuit module comprising a circuit board body having at one end a plurality of extending male blades for contacting with the terminated wiring harness and at the other end receptacles for receiving terminals of the electrical device. In the preferred example, the circuit board body is a singular piece of plastic of a type to which electric circuit conductive traces can be applied by either screen printing or plating to receive surface mounted electric circuits thereon. The electrically conductive traces extend to the extending male blades for contacting the terminated wires to the electric circuit components and to the receptacles for receiving the electrical device wherein the conductive traces carry electrical signals to or from the extending male blades, to or from the receptacles and to or from the electric circuit components. At least some of the extending male blades project out of ribs extending vertically from and coextensive with the length of the circuit board. The extending ribs are covered on three sides with electrically conductive traces to provide increased surface area for high power current to be carried across the circuit board to and/or from the electrical device.

In a preferred example, on each side of the circuit board an extending side rib projects substantially along the length of the circuit board and a slotted guide on each side within the housing receives one of the extending ribs and maintains the circuit board in position within the housing so that the fingers of the circuit board are received at the terminal end of the housing and so that the surface mounted electrical circuit elements are not forced against the inside wall of the housing.

Further, according to another preferred example of this invention, each circuit board side rib has an ear projecting outwardly from the circuit board and angling away from the fingers thereof. As the circuit board is slid into the housing during assembly, each ear forces a deflection of the end of the housing until it engages a slot in the housing, at which time the housing snaps back around the ears to maintain the circuit board within the housing. In a preferred implementation of this invention in which the connector and an electrical device are required to be sealed, the slots for retaining the circuit board by its ears are located within a portion of the housing that is sealed against the environment outside the housing when the electrical device is connected thereto.

In one advantageous example of this invention, a fuse for the electrical device is located within the sealed connector, advantageously locating the fuse device in a serviceable location with the electrical device.

In a unique advantage according to this invention, all of the above features are achieved with two structures, the first structure comprising the singularly fabricated circuit board with electrical traces and circuit components thereon and the second structure comprising the connector housing.

BRIEF DESCRIPTION OF THE DRAWINGS

The present invention will now be described by way of example with reference to the accompanying drawings in which.

DETAILED DESCRIPTION OF THE INVENTION

Figure 1:
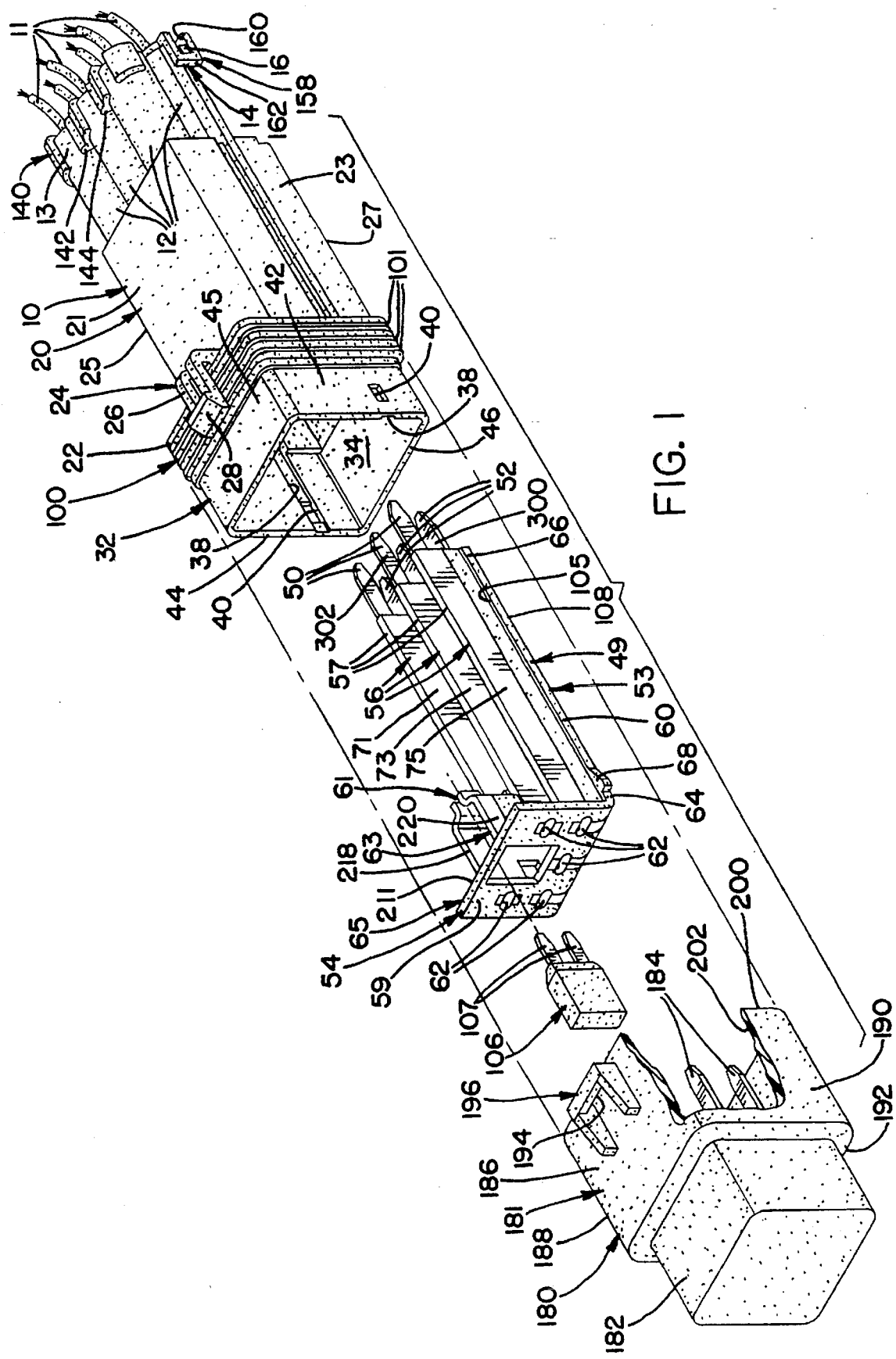
FIG. 1 illustrates an exploded view of an example smart connector according to this invention and an example electrical device for use with the smart connector.
Figure 2:
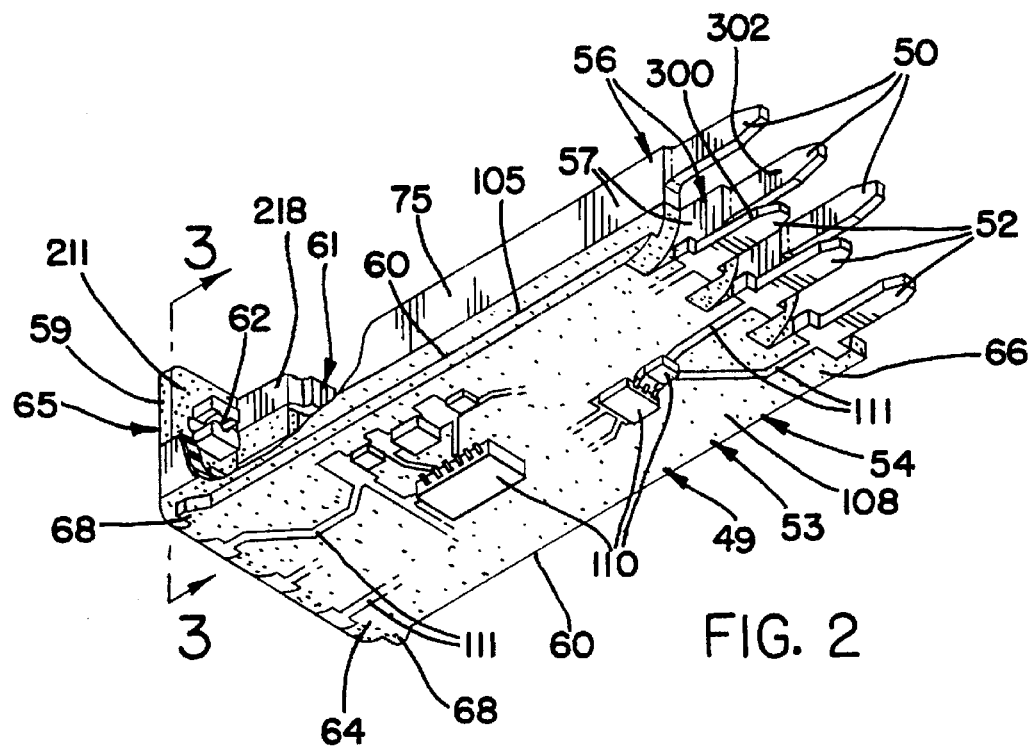
FIGS. 2 and 3 illustrate views of an example circuit board for use in the connector according to this invention.
Figure 3:
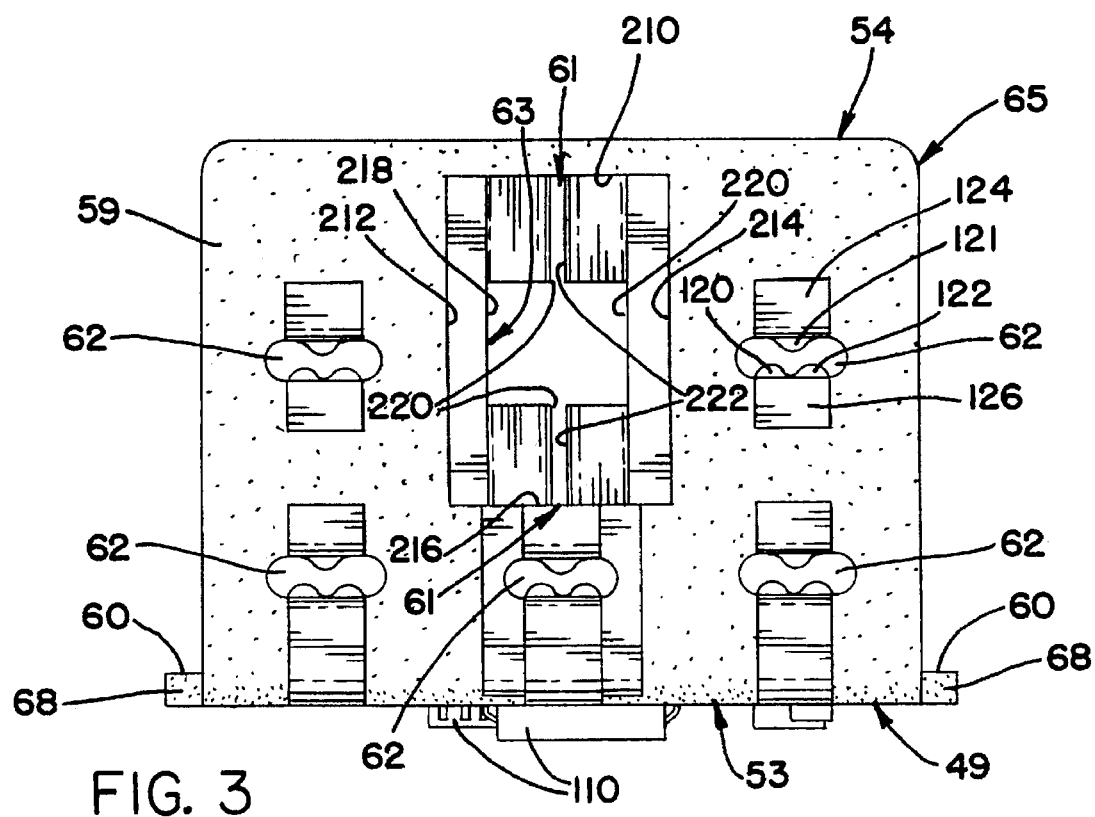

Referring now to FIGS. 1-3, a preferred electrical connector according to this invention for providing a sealed connection to an electrical device is achieved with housing 10, circuit board 54 and seal 100 shown. The housing 10 has at one end a plurality (i.e., typically, but not limited to, five or six) standard sealed female cavities 12 that house the plurality of male blades 50, 52 of the circuit board 54. The cavities 12 also accept a plurality of sealing terminal leads of wires 11 of a wiring harness of a known type. Each of the terminal leads typically has a tang (not shown) that clips into a protrusion (not shown) integrally formed on the inside of each female cavity 12 to hold the terminal in place in a known manner.

The single piece circuit board 54 has a plurality of electrical traces thereon including electrical traces 300, 302 that extend to the male blades 52, 50 shown. Each wiring harness terminal (not shown) for each wire 11 terminated into a cavity 12 makes electrical contact with a printed or plated circuit trace on the corresponding male blades 50, 52 within the cavity 12. A separate terminal position assurance component (TPA) 140 retains the wires 11 in place in a known manner.

Circuit board 54 includes a plurality of ribs 56 that extend vertically from the surface 105, on the opposite side of platform 49 from surface 108, and that extend over a length of the circuit board 54 from male blades 50, 52 to the female receptacles 62. The male blades 50 are formed as integral extensions of the ribs 56 and the shape of ribs 56 allows plating 57 on the top wall and two side walls thereof of high current circuit traces from blades 50 to receptacles 62. The ribs 56 with plating 57 on three sides thereof increases the surface area available for plating or printing of the high current circuit traces running from blades 50 to receptacles 62, distributing the heat across the surface area of the traces allowing more heat dissipation.

TPA 140 is retained at the end of female cavities 12 by retaining feature 14 on each side of the end 13 of the housing 10. Each retaining feature 14 includes an ear 16 slanting back at an angle away from end 13, extending outwardly from the cavities 12 and terminating in a shoulder. During assembly, each slanting back ear 16 causes cantilever deflection of a complementary retaining feature, such as cantilever arm 158 having an open slot 160 with a closed end 162, on the TPA 140. The ear 16 acts on the closed end 162 of the slot 160 to maintain the TPA 140 in place when arm 158 snaps over the outermost portion of ear 16.

TPA 140 includes of a plurality of walls 142, 144 adapted to fit between the receptacles 12 to align the respective terminals (not shown) properly in the receptacle openings and to assist retaining the terminals in the receptacles 12 of housing 10 so the terminals are connected to male blades 50, 52. The TPA device 140 performs this function in a known manner and is configured to match the pattern of the receptacles 12 of housing 10. The terminals (not shown) received into female receptacles 12 include a known seal-type construction that act with the housing 10 to seal the end 13 of the housing 10, preventing entry of exterior elements, i.e., water, into the interior of the housing 10 via receptacles 12. The details of such construction are well known to those skilled in the art and further description thereof need not be set forth herein.

Walls 42, 44, 45 and 46 form a cavity 34 at the electrical device end of the housing 10 and house the portion of the circuit board 54 with the receptacles 62 for receiving the extending male terminals 184 of the electrical device 180.

At the middle portion 20 of the housing 10, walls 21, 23, 25 and 27 define a cavity generally of the same width as that of cavity 34. The cavity defined by the walls 21, 23, 25 and 27 need not be of the same height as cavity 34, instead the height depends on the size of the electrical circuit board and circuit components to be enclosed within the housing. In this example, since the electric circuit board 54 does not require a cavity as tall as cavity 34, the cavity in the middle portion 20 is shorter than the cavity 34 on the electrical device end of the housing 10.

The end 32 of the housing 10 is separated from the middle portion 20 by rib 22 that projects outwardly from the walls 42, 44, 45 and 46 around a periphery of the end of the cavity 34 that adjoins the middle portion 20 of the housing 10. The outwardly extending rib 22 includes a seat for seating seal 100 of a known type. Seal 100 has an interior dimension shaped to snugly fit around the walls 42, 44, 45 and 46 to provide, as will be explained further below, the sealing engagement with the electrical device.

The housing 10 also has integrally fabricated thereon a retaining device 24 comprising a cantilever arm 26 extending from the side 45 of the housing 10 behind the rib 22 and having on the end thereof an ear 28 slanting back toward the female cavities 12. The retaining device 24 cooperates with a retaining structure 196 of the electrical device that includes a closed slot 194 into which the ear 28 snaps to retain the electrical device 180 in place in a known manner.

The view of the circuit board 54 in FIG. 2 shows the large flat surface 108 that is not visible in FIG. 1. Surface 108 serves as the mounting surface for the various surface mounted electrical circuit components 110 and the electrically conductive traces 111 connecting the components 110 that comprise the circuit of the control module.

One skilled in the art will recognize that the circuit board 54 comprises a body 53 with a platform 49, wherein the platform comprises the flat surface 108, a plurality of walls or ribs 56 projecting out of the first end of the body extending parallel to the platform wherein the plurality of walls or ribs 56 terminate as extending male blades 50, 52. At a second end of the body 53 opposite the first end, a structure 65 rises in a direction perpendicular to the platform and forms a plurality of cavities axially aligned parallel to the platform 49 and the male blades 52, wherein each cavity 62 has an open end for receiving a male terminal 184 of an electrical device or relay 180, wherein each open end faces a direction away from the male blades 52.

The circuit board 54, including the male blades 50, 52, the flat surface 108 and the receptacles 62, is preferably singularly formed from an electrically insulative moldable thermo-plastic material, such as Ultem™ plastic, that is suitable for receiving screened or plated electrical circuit traces of the type used in surface mounted circuit boards. Various other suitable materials for the circuit board 54 are well known to those skilled in the art. Singularly formed or fabricated as used herein means that the entire circuit board 54 is formed as one piece and does not include circuit boards comprising two or more pieces attached together.

In one example, the circuit board 54 includes a control circuit such as a timer circuit of a known type for use in controlling a relay 180 to control on/off high current power to a vehicle system. In such implementations, the two or three ends of the relay switch that are used to control the power to the vehicle system are electrically connected directly across the circuit board 54 by uninterrupted circuit traces 71, 73, 75 of electrically conductive material from two or three of the receptacles 62 in the structure 65 at the end 64 of the circuit board 54 to two or three of the blades 50 extending from the opposite end 66 of the circuit board 54. The remaining male blades 52 are electrically connected to the control module circuit providing module power, ground and on/off signals to the remaining receptacles 62 so that the module can responsively drive the coil of relay 180 plugged into the receptacles 62.

In another example, the module may include a microprocessor of a known type and the control input may receive communications messages in a known multiplexing method enabling the microprocessor to determine whether it is being addressed and if so to responsively control the electrical device in response to the incoming control command. Such systems allow multiplex control of various vehicle systems connected to a common control signal line, minimizing the number of control wires required in the vehicle. Additionally the microprocessor may comprise a flexible control circuit and/or provide complex electrical control functions.

Circuit board 54 includes a slot 63 for receiving a fuse 106 that connects in the circuit path of the module power supply to prevent damage thereto in the event of excess current flow. The fuse 106 is removably engaged in slot 63 and the fuse terminals 107 contact appropriate electrical circuit contacts plated into formed terminal receptacles of slots 61, which receive the terminals 107 of fuse 106.

The structure 65 rising perpendicularly from platform 49 thus forms a plurality of receptacles 62 for receiving a plurality of male terminals 184 of an electrical device 180 from side 59 of the structure 65. Structure 65 also defines four walls 210, 212, 214 and 216 bordering a rectangular opening leading into slot 63. Slot 63 is bordered on opposite sides by walls 218 and 220 extending from the side 211 of structure 65 opposite the side 59. The walls 218 and 220 terminate at an end distal from side 211 by extending toward each other to form the diametrically opposing engagement surfaces 220, 222 of slots 61 adapted for friction engagement of the extending male terminals 107 of fuse 106. The fuse 106 is thus received into the same structure 65 that receives the electrical device 180 and is received from the same side 59 of the structure 65 from which the electrical device 180 is received. This structure locates the fuse in the sealed connector proximate to the electrical device for which it provides circuit protection. This provides a service advantage of allowing placement of the fuse and electrical device in a single location and eliminating the task of coordinating which remote mounted fuse belongs to the electrical device.

A rib 60 projects from each side of the circuit board 54 parallel to planar surface 49 and extends lengthwise along most of the circuit board 54. Each rib 60 engages one of the guide slots 38 formed into the side walls 42 and 44 of the end cavity 34 and continuing into the side walls of the cavity in the middle portion 20 of the housing 10. The guide slots 38 guide the circuit board 54 into the housing 10 during assembly thereto and maintain the circuit board in place within the housing, positioning the circuit board so that the surface mounted elements thereon are not pressed against the interior wall of the housing 10.

On the end 64 of the circuit board 54, two ears 68 project out from the ribs 60, one on each rib. During assembly, the ears 68 force slight outward deflection of the walls 42, 44 of the cavity 34 until the ears 68 engage in the slots 40 in the sides 42 and 44. This retains the circuit board in place while allowing removal for service by forcing deflection outward of the walls 42, 44 so that the slots 40 disengage from the ears 68.

The end 64 of the circuit board 54 is shown enlarged in FIG. 3. Although typically referenced on only one receptacle 62, each receptacle 62 includes therein preferably three extending ribs 120, 121, 122 to provide secure electrical contact for the received extending terminals of the electrical device. The three ribs 120, 121, 122 are covered with conducting material 124, 126 applied either by plating or screen printing and, alternatively, the whole interior surface of each receptacle 62 may be covered. For some of the receptacles 62, the conductive material traces 124, 126 lead to the control circuit comprising the surface mounted elements 110 and for other receptacles 62 the conductive circuit traces 124, 126 lead directly to the extending male blades 50, 52 on the other end of the circuit board.

The standard electrical device 180, for example, a relay mounted in the portion 182 of its housing 181, is attached to the connector comprising housing 10 and circuit board 54. The housing 181 of the electrical device 180 includes walls 186, 188, 190 and 192, forming a cavity 202 within which the outside of walls 42, 44, 45 and 46 of the end 32 of housing 10 are received. Extending within the cavity 202, a plurality of terminals 184 (only two shown) for the electrical device engage into receptacles 62 of the circuit board 54 when the electrical device is mounted in place. The end surface 200 of the walls 186, 188, 190, 192 slides over ribs 101 of the seal 100 when the device 180 is assembled to the circuit board 54 and housing 10. The seal's outer ribs 101 fit snugly within the inside surfaces of the walls 186, 188, 190 and 192 of the cavity 202.

When the end 32 of the housing 10 is within cavity 202, the slots 40 are sealed within the walls 186, 188, 190 and 192 and the seal 100 so that the entire interior of the housing 10, including the circuit board assembly, is sealed from the outside environment.

In implementation with relay devices, the circuit board 54 may contain a circuit such as a timer, which is a standard control circuit for controlling relay devices. For example, it is typical to have a timer preventing activation of an air conditioner within a limited amount of time after vehicle start-up. It is also typical to have timers controlling systems such as the rear defogger. The circuit provided on the circuit board 54 may be a flexible circuit that can be selected between one of several modes, such as different timer responses, by simply etching out connector paths to resistors that affect the time delay of the timer so that the resistors left in the circuit provide the required delay.

The above described apparatus according to this invention provides an end connector for a wiring harness terminated in cavities 12, a control circuit module mounted on circuit board 54 for controlling the electrical device, and a connector for an electrical device, all in one unit. The unit is easily assembled according to this invention by sliding the circuit board 54 into the housing 10 from the end 32, engaging the ribs 60 into the slots 38 to guide the circuit board into the homing, wherein the process of sliding the circuit board into the housing positions the male blades 50, 52 in the cavities 12 and positions the receptacles 62 at end 32 of the housing 10. The connector can terminate a wiring harness by receiving a known type of terminals in cavities 12 to make electrical contact with the male blades 50, 52 and plugs into electrical device 180 via receptacles 62.

We claim:

1. A smart connector for an electrical device comprising:
   a circuit board including
      a flat surface for receiving at least one surface-mounted circuit component,
      a plurality of extending male blades formed in a first end of the circuit board,
      a plurality of female receptacles formed at a second end of the circuit board opposite the first end, wherein (i)

an exterior of each of the extending male blades, (ii) an interior of each of the female receptacles and (iii) a select portion of the flat surface all include electrically conductive circuit traces a connector housing having a first end with a plurality of female terminal receptacles for terminating a wiring harness, a body portion for housing the circuit board and a second end, wherein the male blades are each received in a separate one of the plurality of female terminal receptacles and wherein the plurality of female receptacles are located at the second end of the housing for receiving a set of extending male terminals of an electrical device.

2. A smart connector for an electrical device according to claim 1, wherein the connector housing has an interior cavity extending from the second end to the body portion, wherein the circuit board is located within the interior cavity, also comprising:

first and second slots on a pair of opposing walls of the interior cavity, wherein the slots extend from the second end through the body portion;

first and second ribs projecting outwardly from first and second sides of the circuit board and extending substantially from the first end to the second end thereof, wherein the first rib engages the first slot and the second rib engages the second slot to maintain the circuit board located within the housing.

3. A smart connector for an electrical device according to claim 2, also comprising:

first and second ears projecting outwardly from the first and second ribs proximate to the second end of the circuit board;

first and second openings in the second end of the housing, wherein the first opening is in an outside wall of the first slot and the second opening is in an outside wall of the second slot, wherein the first and second ears project through the first and second openings to maintain the circuit board within the housing.

4. A smart connector for an electrical device according to claim 1, wherein the smart connector is sealable to the electrical device, wherein the circuit board and the at least one surface-mounted circuit component are sealed within the connector housing from an environment exterior of the connector housing.

5. A smart connector for an electrical device according to claim 1, wherein the circuit board including the flat surface, the plurality of male blades and the plurality of female receptacles comprises a singularly fabricated one-piece body of thermo-plastic electrically insulative material.

6. A smart connector for an electrical device according to claim 1, wherein the housing including the body portion, the plurality of female terminal receptacles and the second end comprises a singularly fabricated one-piece body of thermo-plastic electrically insulative material.

7. A smart connector for an electrical device according to claim 1, wherein the circuit board comprises:

a body with a platform on one planar side thereof, wherein the platform comprises the flat surface;

a plurality of walls projecting out of the first end of the body extending parallel to the platform wherein the plurality of walls comprises the plurality of extending male blades; and at the second end of the body, a structure rising in a direction perpendicular to the platform and forming a plurality of cavities aligned parallel to the platform and the male blades, wherein each cavity has an open end for receiving a male terminal of the electrical device, wherein each open end faces a direction away from the male blades and wherein the plurality of cavities comprises the plurality of female receptacles.

8. A smart connector for an electrical device according to claim 1, wherein the circuit board comprises:

a body with a platform on one planar side thereof, wherein the platform comprises the flat surface;

at least one rib extending vertically from the platform opposite the planar side, wherein the rib extends lengthwise substantially from the extending male blades to the female receptacles, wherein one of the extending male blades is integrally formed as an extension out of the one rib.

9. A smart connector for an electrical device according to claim 8, wherein the one rib includes an electrical circuit trace on a top wall and first and second side walls thereof, wherein the one rib provides a path for high power current to and/or from the electrical device.

10. A smart connector for an electrical device comprising:

a housing defining a cavity, wherein a first end of the housing terminates an electrical harness and a second end of the housing defines an opening into the cavity;

a circuit board in the cavity within the housing, the circuit board having male blades extending within the housing to the first end and engaging terminals on the electrical harness, the circuit board also including a plurality of receptacles within the housing at the second end, wherein the electrical device includes male terminals engaging the receptacles and is in sealing engagement with the housing, sealing the circuit board within the housing.

11. A smart connector for an electrical device according to claim 10, wherein the circuit board includes a platform and a structure rising perpendicularly from the platform, wherein the receptacles are located in the structure.

12. A smart connector for an electrical device according to claim 11, wherein the structure includes a first planar surface facing the electrical device and a second planar surface facing away from the electrical device, wherein the receptacles are defined by the first planar surface and wherein the male terminals of the electrical device are received in the receptacles from the first planar surface side of the structure.

13. A smart connector for an electrical device according to claim 12, wherein the structure defines a rectangular opening in the first planar surface extending into a slot in a direction away from the electrical device, wherein a fuse is received into the slot from the first planar surface side of the structure.

14. A smart connector for an electrical device according to claim 13, wherein the slot is bounded on first and second sides by first and second walls extending from the second planar surface of the structure in a direction away from the electrical device.

15. A smart connector for an electrical device according to claim 14, wherein the first and second walls terminate at an end distal from the second planar surface, extending toward each other to form opposing walls for engaging terminals of the fuse.

\* \* \* \* \*